(12) United States Patent
Kulkarni et al.

(10) Patent No.: US 9,562,814 B2
(45) Date of Patent: Feb. 7, 2017

(54) MANUFACTURING STRAIN SENSITIVE SENSORS AND/OR STRAIN RESISTANT CONDUITS FROM A METAL AND CARBON MATRIX

(75) Inventors: Giridhar Udapi Rao Kulkarni, Bangalore (IN); Boya Radha, Bangalore (IN); Abhay Abhimanyu Sagade, Bangalore (IN)

(73) Assignee: JAWAHARLAL NEHRU CENTRE FOR ADVANCED SCIENTIFIC RESEARCH, Bangalore, Karnataka (IN)

(*) Notice: Subject to any disclaimer, the term of this patent is extended or adjusted under 35 U.S.C. 154(b) by 338 days.

(21) Appl. No.: 14/124,243

(22) PCT Filed: Jun. 7, 2012

(86) PCT No.: PCT/IB2012/052872
§ 371 (c)(1),
(2), (4) Date: Dec. 5, 2013

(87) PCT Pub. No.: WO2012/168892
PCT Pub. Date: Dec. 13, 2012

(65) Prior Publication Data
US 2014/0174190 A1    Jun. 26, 2014

(30) Foreign Application Priority Data
Jun. 7, 2011   (IN) .......................... 1940/CHE/2011

(51) Int. Cl.
*G01L 1/20*    (2006.01)
*G01L 1/22*    (2006.01)
(Continued)

(52) U.S. Cl.
CPC .................. *G01L 1/20* (2013.01); *B82Y 15/00* (2013.01); *G01L 1/2287* (2013.01); *H05K 3/30* (2013.01); *Y10T 29/49103* (2015.01)

(58) Field of Classification Search
CPC ........................................................ G01L 1/20
(Continued)

(56) References Cited

U.S. PATENT DOCUMENTS 4,515,866 A * 5/1985 Okamoto ................ C22C 49/00
                                              419/11
4,920,806 A * 5/1990 Obama .................... G01B 7/24
                                             324/209

(Continued)

FOREIGN PATENT DOCUMENTS

CN    101059380 A    2/2007
CN    101380257 A    3/2009
(Continued)

OTHER PUBLICATIONS

International Search Report and Written Opinion; Application No. PCT/IB2012/052872, filed Jun. 7, 2012, date of mailing Oct. 16, 2012.

(Continued)

*Primary Examiner* — Michael A Lyons
*Assistant Examiner* — Jamel Williams
(74) *Attorney, Agent, or Firm* — Dorsey & Whitney LLP

(57) ABSTRACT

Implementations and techniques for manufacturing strain sensitive sensors and/or strain resistant conduits from a metal and carbon matrix are generally disclosed.

23 Claims, 16 Drawing Sheets

(51) Int. Cl.
    *B82Y 15/00*    (2011.01)
    *H05K 3/30*    (2006.01)

(58) Field of Classification Search
    USPC .......................................................... 73/774
    See application file for complete search history.

(56) References Cited

U.S. PATENT DOCUMENTS

| | | | |
|---|---|---|---|
| 5,915,285 A | 6/1999 | Sommer | |
| 6,181,011 B1 | 1/2001 | Rostoker et al. | |
| 2003/0200814 A1* | 10/2003 | Oh ......................... | G01L 3/102 73/779 |
| 2004/0159161 A1* | 8/2004 | Barnett .................. | G01D 3/022 73/766 |
| 2004/0239475 A1* | 12/2004 | Hermann .............. | G01L 1/2293 338/25 |
| 2009/0179523 A1* | 7/2009 | Wang ..................... | B82Y 10/00 310/338 |
| 2010/0119789 A1* | 5/2010 | Grande .................. | C09D 11/30 428/208 |

FOREIGN PATENT DOCUMENTS

| | | |
|---|---|---|
| CN | 101762349 A | 6/2010 |
| JP | H08507429 | 8/1996 |
| JP | 2004-538494 | 12/2004 |

OTHER PUBLICATIONS

Reuss et al., Macroelectronics: Perspectives on Technology and Applications. *Proc. IEEE* 2005, 93, 1239.
Zhou et al., Flexible Piezotronic Strain Sensor. *Nano Lett.* 2008, 8, 3035.
Laukhina et al., Ultrasensitive Piezoresistive All-Organic Flexible Thin Films. *Adv. Mater.* 2010, 22, 977.
Park et al., Light Emission Characteristics and Mechanics of Foldable Inorganic Light-Emitting Diodes. *Adv. Mater.*2010, 22, 3062.
Lee et al., Bendable GaN High Electron Mobility Transistors on Plastic Substrates. *J. Appl. Phys.* 2006, 100.
Kim et al., High-Performance Flexible Graphene Field Effect Transistors with Ion Gel Gate Dielectrics. *Nano Lett.* 2010, 10, 3464.
Sun et al., Bendable GaAs Metal-Semiconductor Field-Effect Transistors formed with Printed GaAs Wire Arrays on Plastic Substrates. *Appl. Phys. Lett.* 2005, 87, 1.
Tiwari et al., Flexible CdTe Solar Cells on Polymer Films. *Prog. Photovolt: Res. Appl.* 2001, 9, 211.
Liu et al., Vertically Oriented $TiO_2$ Nanotube Arrays Grown on Ti Meshes for Flexible Dye-Sensitized Solar Cells. *J. Phys. Chem. C* 2009, 113, 14028.
Tong et al., Flexible Sandwich Photodetectors Based on Thick Polythiophene Films. *J. Phys. Chem. C* 2009, 113, 7411.
Yun et al., Resistance Switching Memory Devices Constructed on Plastic with Solution-Processed Titanium Oxide. *J. Mater.Chem.* 2009, 19, 2082.
Choi et al., Nanoscale Networked Single-Walled Carbon-Nanotube Electrodes for Transparent Flexible Nanogenerators. *J. Phys. Chem. C* 2009, 114, 1379.
Choi et al., Fully rollable Transparent Nanogenerators Based on Graphene Electrodes. *Adv. Mater.*2010, 22, 2187.
Takahashi et al., Parallel Array InAs Nanowire Transistors for Mechanically Bendable, Ultrahigh Frequency Electronics. *ACS Nano* 2010, 4, 5855.
Gomez et al., Continuous, Highly Flexible, and Transparent Graphene Films by Chemical Vapor Deposition for Organic Photovoltaics. *ACS Nano* 2010, 4, 2865.
Ahn et al., Heterogeneous Three-Dimensional Electronics by Use of Printed Semiconductor Nanomaterials. *Science* 2006, 314, 1754.

Kang et al., A Carbon Nanotube Strain Sensor for Structural Health Monitoring. *Smart Mater. Struct.* 2006, 15, 737.
Anderson, J. C., Thin Film Transducers and Sensors. *J. Vac. Sci. Tech. A* 1986, 4, 610.
Chiriac et al., Thin Films as Strain-Sensitive Materials for Piezoresistive Sensors. *Sensor. Actuat. A* 1999, 76, 376.
Lichtenwalner et al., Flexible Thin Film Temperature and Strain Sensor Array Utilizing a Novel Sensing Concept. *Sensor. Actuat. A* 2007, 135, 593.
Chung et al., Strain Sensors Based on the Electrical Resistance Change Accompanying the Reversible Pull-Out of Conducting Short Fibers in a Less Conducting Matrix. *Smart Mater. Struct.* 1995, 4, 59.
Lisong et al., Flexible Substrate Micro-Crystalline Silicon and Gated Amorphous Silicon Strain Sensors. *IEEE Trans. Electron Dev.*, 2006, 53, 380.
Latessa et al., Piezoresistive Behaviour of Flexible PEDOT:PSS Based Sensors. *Sensor. Actuat. B* 2009, 139, 304.
Takamatsu et al., Transparent Conductive-Polymer Strain Sensors for Touch Input Sheets of Flexible Displays. *J. Micromech. Microengg.* 2010, 20, 075017.
Chang et al., Fabrication of Single-Walled Carbon Nanotube Flexible Strain Sensors with High Sensitivity. *App. Phys. Lett.* 2008, 92, 063501.
Vossmeyer et al., Networked Gold-Nanoparticle Coatings on Polyethylene: Charge Transport and Strain Sensitivity. *Adv. Func. Mater.* 2008, 18, 1611.
Siffalovic et al., Towards Strain Gauges Based on a Self-Assembled Nanoparticle Monolayer SAXS Study. *Nanotech.* 2010, 21, 385702.
Mueggenburg et al., Elastic Membranes of Close-Packed Nanoparticle Arrays. *Nat. Mater.* 2007, 6, 656.
Liu et al., Novel ZnO Nanorod Flexible Strain Sensor and Strain Driving Transistor with an Ultrahigh $10^7$ Scale "On"-"Off" Ratio Fabricated by a Single-Step Hydrothermal Reaction. *J. Phys. Chem. C* 2011, 115, 570.
Gullapalli et al., Flexible Piezoelectric ZnO-Paper Nanocomposite Strain Sensor. *Small* 2010, 6, 1641.
Radha et al., Modified Micromolding Method for Sub-100-nm Direct Patterning of Pd Nanowires. *Small* 2009, 5, 2271.
Tiwari et al., 12.8% Efficiency $Cu(In,Ga)Se_2$ Solar Cell on a Flexible Polymer Sheet. *Prog. Photovolt: Res. Appl.* 1999, 7, 393.
Bhuvana et al., Highly Conducting Patterned Pd Nanowires by Direct-Write Electron Beam Lithography. *ACS Nano* 2008, 2, 457.
Goryainova et al., Raman Study of WDoped Diamond Like Carbon Films. *Bull. Russ. Acad. Sci.* 2009, 73, 874.
Cao et al., Electromechanical Properties of Metallic, Quasimetallic, and Semiconducting Carbon Nanotubes under Stretching. *Phys. Rev. Lett.* 2003, 90, 157601.
Bhuvana et al., Inkjet Printing of Palladium Alkanethiolates for Facile Fabrication of Metal Interconnects and Surface-Enhanced Raman Scattering Substrates. *Micro Nano Lett.* 2010, 5, 296.
"Strain Gauges," IPA, accessed at http://www.ipaindia.com/sensors/strain-guage/, accessed on Jan. 16, 2015, pp. 1-3; Copyright 2014.
"Kapton Tapes, 1 Mil Kapton Tape," accessed at http://www.kaptontape.com/Kapton_Film.php, accessed on Jan. 16, 2015, p. 1-1; Copyright 2015.
Alpuim, P., et al,, "Fabrication of a strain sensor for bone implant failure detection based on piezoresistive doped nanocrystalline silicon," Journal of Non-Ctystalline Solids, vol. 354, Issue 19-25, pp. 2585-2589 (May 1, 2008).
Radha, B., et al., "Direct Micromolding of Pd u-Stripes for Electronic Applications,"Joural of Nanoscience and Nanochnology, vol. 11, pp. 1-6 (2011).
Sagade, A., et al., "Intricate nature of Pd nanocrystal—hydrogen interaction investigated using thermolysed Pd hexadecylthiolate films," Sensors and Actuators B: Chemical, vol. 149, pp. 345-351 (2010).
Shui, X., and Chung, D. D. L., "A piezoresistive carbon filament polymer-matrix composite strain sensor," Smart Materials and Structures, vol. 5, No. 2, pp, 243-246 (1996).
Stampfer, C,, et al., "Fabrication of Single-Walled Carbon-Nanotube-Based Pressure Sensors," Nano Lett., vol. 6, Issue 2, pp. 233-237 (2006).

(56) References Cited

OTHER PUBLICATIONS

Wichmann, M. H. G., et al., "Direction sensitive bending sensors based on multi-wall carbon nanotube/epoxy nanocomposites," Nanotechnology, vol. 19, No. 47, pp. 5 (2008).
Xu, F., et al., "Strain-Release Assembly of Nanowires on Stretchable Substrates," ACS NAno, vol. 5, Issue 2, pp. 1556-1563 (2011).
Window, A. L. Strain Gauge Technology, $2^{nd}$ ed.; *Elsevier Appl. Sci.*: Essex (England), 1992.

\* cited by examiner

1400 A computer program product

1402 A signal bearing medium

1404 Machine-readable instructions, which, if executed by one or more processors, operatively enable a computing device to:

deposit a plurality of metal traces substantially parallel to one another on a substrate, wherein the traces include palladium;

cure the plurality of metal traces for a specified time and temperature to form a palladium and carbon matrix, wherein the cured metal traces have a gauge factor from about three-hundred to about four-hundred in response to strain; and/or deposit a first electrode in contact with one end of the plurality of metal traces and a second electrode in contact with an opposite end of the plurality of metal traces.

| 1406 a computer-readable medium | 1408 a recordable medium | 1410 a communications medium |

FIG. 14

MANUFACTURING STRAIN SENSITIVE SENSORS AND/OR STRAIN RESISTANT CONDUITS FROM A METAL AND CARBON MATRIX

CROSS-REFERENCE TO RELATED APPLICATIONS

This application is the U.S. national phase entry under 35 U.S.C. §371 of PCT/IB2012/052872, filed Jun. 7, 2012, designating the U.S., which claims priority under 35 U.S.C. 35 U.S.C. §119(a) to India Patent Application No. 1940/CHE/2011, filed on Jun. 7, 2011. The contents of these applications are herein incorporated by reference in their entirety.

BACKGROUND

Unless otherwise indicated herein, the approaches described in this section are not prior art to the claims in this application and are not admitted to be prior art by inclusion in this section.

Flexible electronics, in contrast to conventional electronics, may make use of material components with a wide range of responses to bending, stretching or twisting. In a flexible circuit, the conduits and interconnects may be designed to exhibit near zero gauge factor (e.g., the relative change in its resistance divided by the strain applied) over repeated bending.

SUMMARY

Some example methods, apparatus, and systems described herein may relate to manufacturing strain sensitive sensors and/or strain resistant conduits composed of a metal and carbon matrix.

Some example apparatus and systems may relate to strain sensitive sensors and/or strain resistant conduits. Such an apparatus may include a substrate, a first flexible electronic part, and/or a second flexible electronic part. Such a first flexible electronic part may be located on the substrate, where the first flexible micro-meter sized electronic part may include a substantially strain resistant conduit. Such a second flexible electronic part may be located on the substrate, where the second flexible micro-meter sized electronic part may include a strain sensitive sensor. The substantially strain resistant conduit and the strain sensitive sensor may both include a metal and carbon matrix.

Some example apparatus and systems may relate to strain resistant conduits. Such an apparatus may include a substrate and/or a first flexible electronic part. Such a first flexible electronic part may be located on the substrate, where the first flexible electronic part may include a substantially strain resistant conduit. Such a substantially strain resistant conduit may include a palladium and carbon matrix with a carbon content ranging from about thirty-six weight percent to about forty weight percent.

Some example apparatus and systems may relate to strain sensitive sensors. Such an apparatus may include a substrate and/or a first flexible electronic part. Such a first flexible electronic part may be located on the substrate, where the first flexible electronic part may include a strain sensitive sensor. Such a strain sensitive sensor may include a palladium and carbon matrix.

Some example methods may include forming a strain sensitive sensor. Such a strain sensitive sensor may include a plurality of metal traces being deposited substantially parallel to one another on a substrate, where the traces may include palladium. The plurality of metal traces may be cured for a specified time and temperature to form a palladium and carbon matrix, where the cured metal traces may have a gauge factor from about three-hundred to about four-hundred in response to strain. A first electrode may be deposited in contact with one end of the plurality of metal traces and a second electrode may be deposited in contact with an opposite end of the plurality of metal traces.

Some example methods may include forming a strain resistant conduit. Such a strain resistant conduit may include a metal trace deposited on a substrate, where the traces may include palladium. The metal trace may be cured for a specified time and temperature to form a palladium and carbon matrix, where the specified time and temperature may be a time of about thirty minutes at a temperature of about two hundred thirty degrees Celsius.

Some example articles may include machine-readable instructions for forming a strain sensitive sensor. Such a strain sensitive sensor may include a plurality of metal traces being deposited substantially parallel to one another on a substrate, where the traces may include palladium. The plurality of metal traces may be cured for a specified time and temperature to form a palladium and carbon matrix, where the cured metal traces may have a gauge factor from about three-hundred to about four-hundred in response to strain. A first electrode may be deposited in contact with one end of the plurality of metal traces and a second electrode may be deposited in contact with an opposite end of the plurality of metal traces.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the drawings:

FIG. 14 is an illustration of an example computer program product;

DETAILED DESCRIPTION

Figure 1:
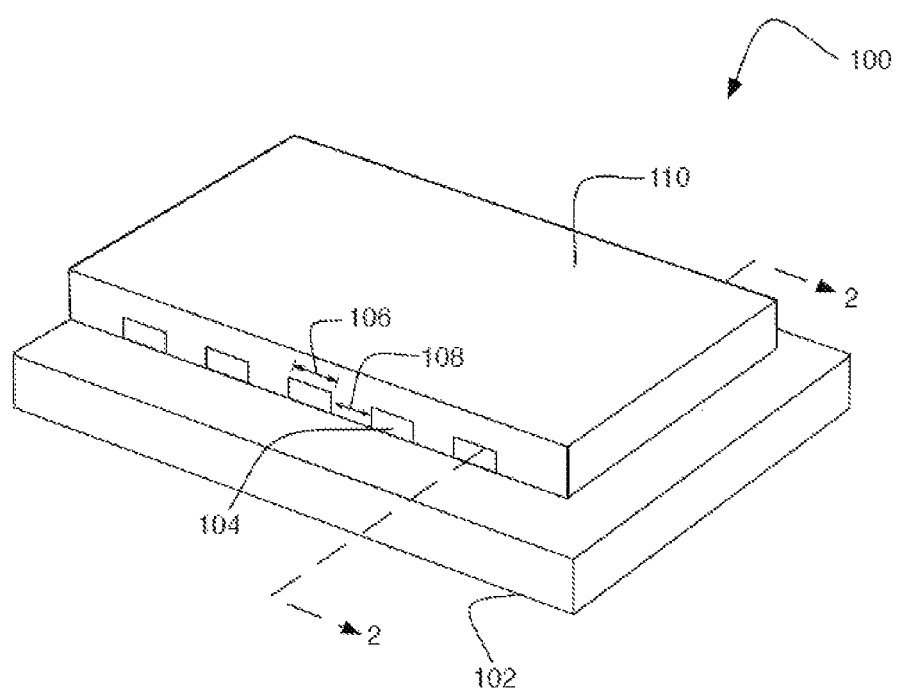
FIG. 1 is an illustration of a perspective view of an example strain sensitive sensor or strain resistant conduit at a given stage of processing.

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is generally drawn, inter alia, to methods, apparatus, and systems related to manufacturing strain sensitive sensors and/or strain resistant conduits from a metal and carbon matrix.

Flexible electronics, in contrast to conventional electronics, makes use of material components with wide range of response to bending, stretching or twisting; either being highly responsive to strain or highly resistive to strain. While components that are responsive to strain may be found in device parts such as touch sensitive displays, components that are resistive to strain may be utilized as conduits (e.g., conduits and/or interconnects).

FIG. 1 is an illustration of a perspective view of an example strain sensitive sensor or strain resistant conduit at a given stage of processing, arranged in accordance with at least some embodiments of the present disclosure. In the illustrated example, a flexible electronic part 100 may be implemented as a strain sensitive sensor located on a substrate 102. As used herein the term "strain" may refer to any variety of strain including but not limited to tensile strain, compressive strain, bending strain, axial strain, shear strain, or torsional strain, the like, and/or combinations thereof. Similarly, the term "strain sensitive" may refer to a material's property of being responsive to any variety of strain including but not limited to tensile strain, compressive strain, bending strain, axial strain, shear strain, or torsional strain, the like, and/or combinations thereof.

In some examples, substrate 102 may be flexible. Additionally or alternatively, substrate 102 may tolerate high temperatures (e.g., a temperature of about one-hundred and ninety-five degrees Celsius, two-hundred and thirty degrees Celsius, and/or two-hundred and fifty degrees Celsius, depending on the particular application). In some examples, substrate 102 may vary in thickness and/or diagonal width. For example, depending on the particular application substrate 102 may have a diagonal width from about one inch (e.g., for a mobile phone or the like) to about thirty inches (e.g., for a flexible computer monitor or the like). Experiments were conducted using a flexible polyimide substrate with a thickness of about twenty micrometers, although other thicknesses may be suitable. In some examples, substrate 102 may include one or more of the following substances: flexible polyimide, polyester, polyethylene naphthalate, aramid, poly(dimethylsiloxane), epoxy, and/or liquid crystal polymer. For example, substrate 102 may be composed of flexible polyimide.

In some examples, such a flexible electronic part 100 may be micrometer sized. For example, flexible electronic part 100 may include individual metal traces 104 that may have a width 106 of about one micrometer. Such individual metal traces 104 may be spaced apart by a spacing 108 of about one-half micrometer, although other widths 106 and spacing 108 may be utilized. Such individual metal traces 104 may be composed of metal and carbon matrix (e.g., a palladium and carbon matrix). In other examples, individual metal traces 104 may have a width 106 in a range of about one hundred nanometers to about ten microns.

In some examples, deposition of metal traces 104 may be done via stamping on substrate 102. For example, such stamping may involve using a polydimethylsiloxane (PDMS) stamp 110 or the like. Other processes, besides stamping, may be used to deposit a metal and carbon matrix on the substrate.

Figure 2:
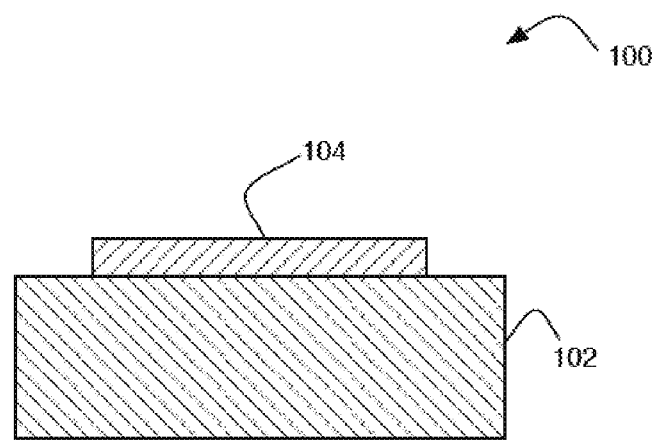
FIG. 2 is an illustration of a cross-sectional view of an example strain resistant conduit at a given stage of processing taken along line 2-2 of FIG. 1.

FIG. 2 is an illustration of a cross-sectional view of an example strain resistant conduit at a given stage of processing taken along line 2-2 of FIG. 1, arranged in accordance with at least some embodiments of the present disclosure. In the illustrated example, flexible electronic part 100 may be implemented as a strain resistant conduit located on substrate 102. Unlike the "strain sensitive" example discussed above with regard to FIG. 1, a "strain resistant" material may be non-responsive to strain. For example, such a substantially strain resistant conduit may have a zero-to-near-zero gauge factor in response to strain. As used herein the term "strain resistant" may refer to a material's property of being non-responsive to any variety of strain, including but not limited to tensile strain, compressive strain, bending strain, axial strain, shear strain, torsional strain, or the like, and/or combinations thereof.

As used herein the term "conduit" may refer to an interconnect, an electrode, a connector, a wire, a conductive trace, the like, and/or combinations thereof. For example, flexible electronic part 100 may include individual metal traces 104 as such a conduit, where metal traces 104 may have a width of about one micrometer, although other widths may be utilized, and is not limited in this respect. Such individual metal traces 104 may be composed of metal and carbon matrix (e.g., a palladium and carbon matrix).

Figure 3:
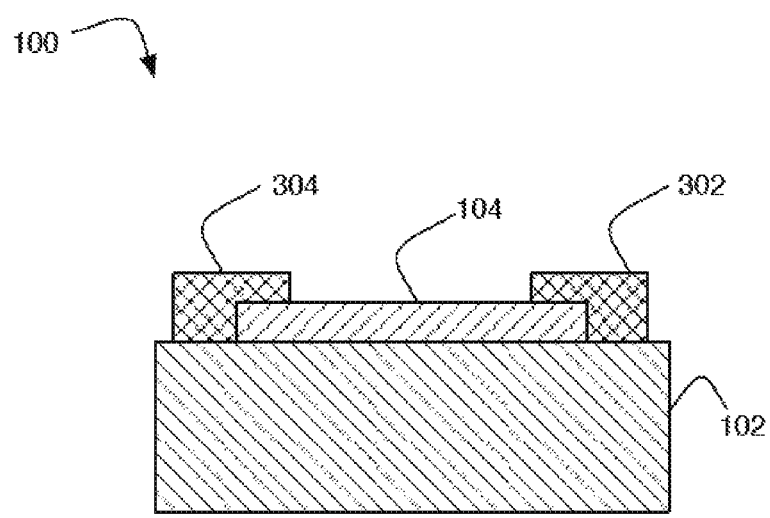
FIG. 3 is an illustration of a cross-sectional view of an example strain sensitive sensor at a given stage of processing.

FIG. 3 is an illustration of a cross-sectional view of an example strain sensitive sensor at a given stage of processing taken along line 2-2 of FIG. 1, arranged in accordance with at least some embodiments of the present disclosure. In the illustrated example, flexible electronic part 100 may be implemented as a strain sensitive sensor located on a substrate 102. In such an example, a first electrode 302 may be deposited in contact with one end of the plurality of metal traces 104 and a second electrode 304 in contact with an opposite end of the plurality of metal traces 104. In some examples, first electrode 302 and second electrode 304 may be composed of a metal capable of forming ohmic contact with metal traces 104, such as one or more of the following materials gold, silver, copper, platinum, palladium, nickel, cobalt, the like, and/or combinations thereof, for example.

Figure 16:
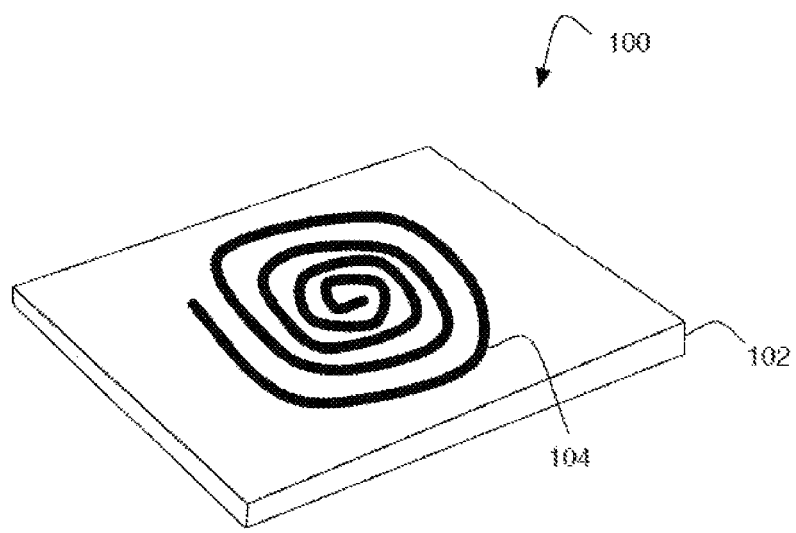
FIG. 16 is an illustration of a perspective view of an example strain sensitive sensor or strain resistant conduit at a given stage of processing, all arranged in accordance with at least some embodiments of the present disclosure.

FIG. 16 is an illustration of a perspective view of an example strain sensitive sensor or strain resistant conduit at a given stage of processing, arranged in accordance with at least some embodiments of the present disclosure. In the illustrated example, flexible electronic part 100 may include metal trace 104 in the shape of a coil and/or spiral located on substrate 102. Such coil and/or spiral shaped metal traces 104 may be implemented as a strain sensitive sensor or as a strain resistant conduit.

Figure 4:
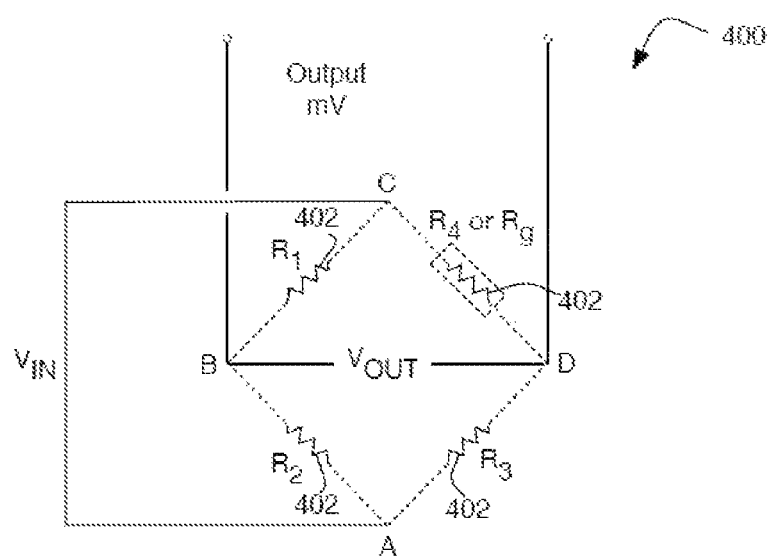
FIG. 4 is an illustration of a circuit diagram of an example strain sensitive sensor group.

FIG. 4 is an illustration of a circuit diagram of an example strain sensitive sensor group, arranged in accordance with at least some embodiments of the present disclosure. In the illustrated example, a group 400 of several strain sensitive sensors 402 (e.g., as illustrated above with respect to FIGS. 1 and 3) may be arranged as a Wheatstone bridge circuit. For example, it is possible to enhance the sensitivity of an individual strain sensitive sensor 402 by arrangement with several other strain sensitive sensors 402 in Wheatstone bridge fashion.

In the illustrated example, a four-strain sensitive sensor 402 Wheatstone bridge, two strain sensitive sensors 402 may be wired in compression, and two strain sensitive sensors 402 may be wired in tension. For example, if R1 and R3 strain sensitive sensors 402 are in tension (positive) and R2 and R4 strain sensitive sensors 402 are in compression (negative), then the output may be proportional to the sum of all the strains measured separately. For strain sensitive sensors 402 located on adjacent legs, the group 400 may become unbalanced in proportion to the difference in strain. For strain sensitive sensors 402 on opposite legs, the group 400 may balance in proportion to the sum of the strains. Whether bending strain, axial strain, shear strain, or torsional strain is being measured; the group 400 arrangement may be utilized to determine the relationship between the output and the type of strain being measured. For example, if a positive tensile strain occurs on R2 and R3 strain sensitive sensors 402, and a negative strain is experienced by R1 and R4 strain sensitive sensors 402, the total output, VOUT, may be about four times the resistance of a single strain sensitive sensor 402.

Figure 5:
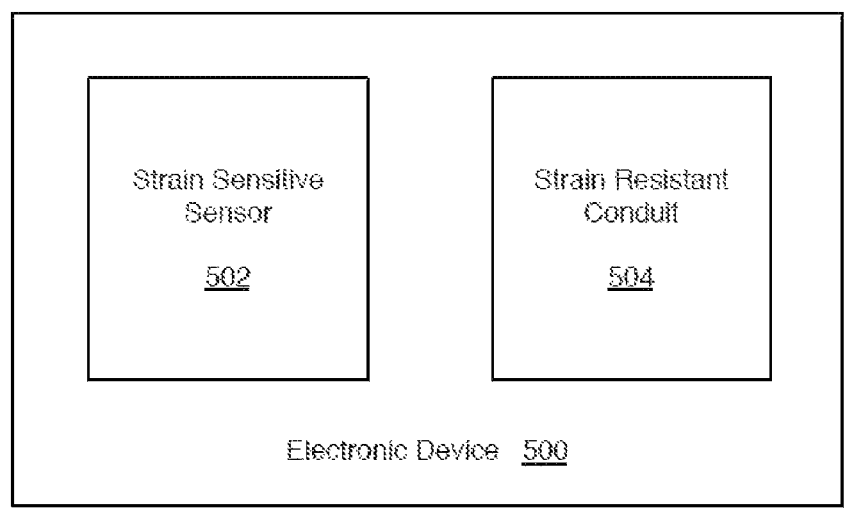
FIG. 5 is an illustration of a schematic view of an example electronic device including a strain sensitive sensor and/or a strain resistant conduit.

FIG. 5 is an illustration of a schematic view of an example electronic device 500 including a strain sensitive sensor 502 and/or a strain resistant conduit 504, arranged in accordance with at least some embodiments of the present disclosure. In the illustrated example, electronic device 500 may include strain sensitive sensor 502 (e.g., flexible electronic part 100 of FIG. 3 and/or group 400 of FIG. 4) and/or strain resistant conduit 504 (e.g., flexible electronic part 100 of FIG. 2), where both may include a metal and carbon matrix.

As will be discussed in more detail below with regard to FIG. 6, it may be possible to form both strain sensitive sensor 502 and a strain resistant conduit 504 from the same or similar materials processed under different conditions. For example, by varying the curing temperature applied to individual metal traces, the same or similar deposited materials may be processed to form both strain sensitive sensors and substantially strain resistant conduits. For example, metal traces cured at one temperature may result in a palladium and carbon matrix suitable for a strain sensitive sensor, while metal traces cured at a second temperature may result in a palladium and carbon matrix suitable for a substantially strain resistant conduit.

In some examples, such an electronic device 500 may include one or more a touch sensitive displays, a flexible solar cell, a flexible display, a stretchable display, a rollable display, or the like and/or combinations thereof, for example. For example, flexible strain resistant conduits (e.g., conduits and metal interconnects) are of interest in various technological applications such as displays, electronic gadgets such as cellular telephone or personal data assistant type of devices, rollable photovoltaics, etc. Strain sensitive sensors with suitable gauge factors that are simple to fabricate may also be useful in many fields such as structural health monitoring of buildings, automotives etc. Such strain sensitive sensors may be utilized in electronic weighing balances. The sensitivity of such a balance may be improved by having a strain sensitive sensors. Owing to the flexible nature of the strain sensitive sensors described herein, such strain sensitive sensors could be mounted onto even non-planar surfaces. The additional strain incurred upon the pre-strained strain sensitive sensor on non-planar surface could still be measured. For example, such strain sensitive sensors may be bent and/or contorted to conform to the shape of a non-planar surface. In operation, such strain sensitive sensors may have the unexpected ability to start from a baseline contorted position and then allow for strain measurement to be made with respect to movement relative to such a baseline contorted position.

Figure 6:
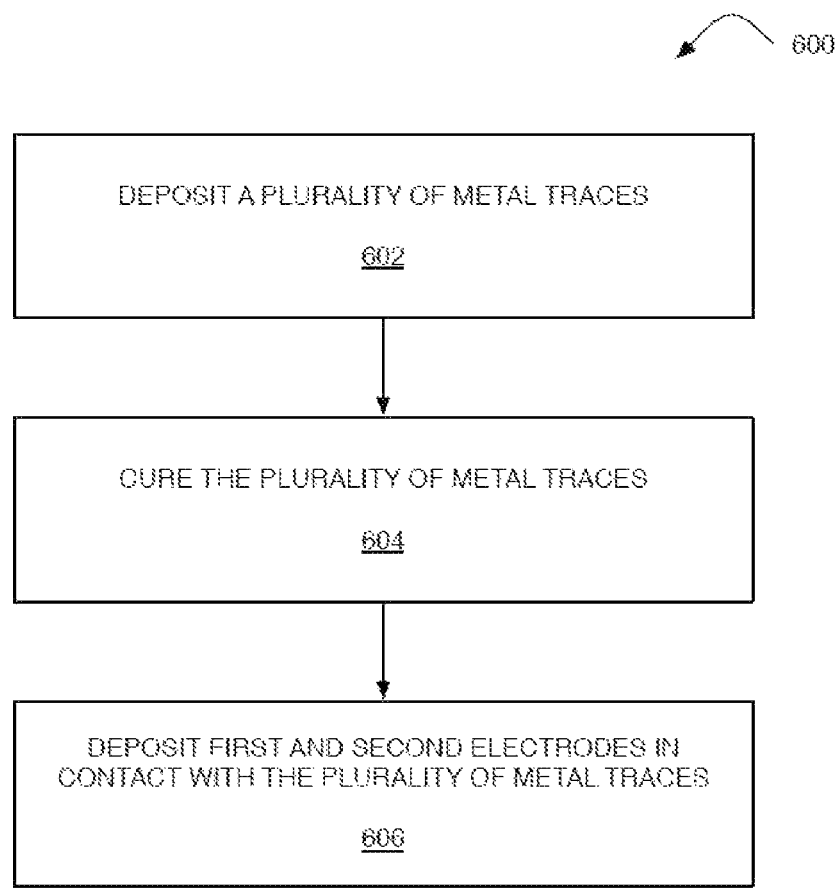
FIG. 6 is an illustration an example process for forming strain sensitive sensor.

FIG. 6 is an illustration an example process for forming strain sensitive sensor, arranged in accordance with at least some embodiments of the present disclosure. In the illustrated example, process 600, and other processes described herein, set forth various functional blocks or actions that may be described as processing steps, functional operations, events and/or acts, etc. Those skilled in the art in light of the present disclosure will recognize that numerous alternatives to the functional blocks shown in FIG. 6 may be practiced in various implementations. For example, although process 600, as shown in FIG. 6, comprises one particular order of blocks or actions, the order in which these blocks or actions are presented does not necessarily limit claimed subject matter to any particular order. Likewise, intervening actions not shown in FIG. 6 and/or additional actions not shown in FIG. 6 may be employed and/or some of the actions shown in FIG. 6 may be eliminated, without departing from the scope of claimed subject matter. Process 600 may include one or more of operations as illustrated by blocks 602, 604, and/or 606.

As illustrated, process 600 may be implemented to form a strain sensitive sensor. Processing may begin at operation 602, "DEPOSIT A PLURALITY OF METAL TRACES", where a plurality of metal traces may be deposited. For example, a plurality of metal traces may be deposited substantially parallel to one another on a substrate. Such traces may include palladium. Individual metal traces may have a width of about one micrometer, for example.

In some examples, such deposition may be done via stamping on the substrate. For example, such stamping may involve using a polydimethylsiloxane (PDMS) stamp or the like. Other processes, besides stamping, may be used to deposit a metal and carbon matrix on the substrate. For example, such deposition may be done via patterning by e-beam, sputtering, patterning by photolithography, chemical vapor deposition (CVD), printing (e.g., inkjet printing or the like), electrospinning, shadow masks, the like or combinations thereof.

Additionally or alternatively, adhesives may optionally be used to bond metal traces to the substrate. Such adhesives include polyester, epoxy, acrylic, PI, glass epoxy, the like, and/or combinations thereof, for example. Such adhesives may need to be matched with the particular substrates, depending upon the substrate properties.

Processing may continue from operation 602 to operation 604, "CURE THE PLURALITY OF METAL TRACES", where the plurality of metal traces may be cured. For example, the plurality of metal traces may be cured for a specified time and temperature (e.g., in ambient conditions on a hot plate, or the like) to form a palladium and carbon matrix. In implementations for forming a strain sensitive sensor, the plurality of metal traces may be cured for a time of about thirty minutes at a temperature of about one-hundred and ninety-five degrees Celsius, for example. Such a palladium and carbon matrix may have an about fifty-eight percent carbon content and/or may have a metal nanoparticle size primarily of about six to ten nanometers (e.g., at least one metal nanoparticle may be this size, the mean nanoparticle size may be this size, or the like).

Processing may continue from operation 604 to operation 606, "DEPOSIT FIRST AND SECOND ELECTRODES IN CONTACT WITH THE PLURALITY OF METAL TRACES", where first and second electrodes may be deposited in contact with the plurality of metal traces. For example, a first electrode may be deposited in contact with one end of the plurality of metal traces and a second electrode may be deposited in contact with an opposite end of the plurality of metal traces.

In some examples, such deposition may be done via shadow masking on the substrate. Other processes, besides shadow masking, may be used to deposit first and second electrodes on the substrate. For example, such deposition may be done via patterning by e-beam, deposition by resistive heating, chemical vapor deposition (CVD), printing (e.g., inkjet printing or the like), electrospinning, stamping, the like or combinations thereof.

Additionally or alternatively, some or all of the same or similar operations described above for forming a strain sensitive sensor may be performed to form a substantially strain resistant conduit. For example, in implementations for forming substantially strain resistant conduit, one or more metal traces may be deposited in the same or similar manner at that described in operation 602. Further, in implementations for forming substantially strain resistant conduit, such one or more metal traces may be cured at a temperature of about two-hundred and thirty degrees Celsius in the same or similar manner at that described in operation 604, for example. In some embodiments, such curing may be conducted at a temperature of about two-hundred and thirty degrees Celsius to about two-hundred and fifty degrees Celsius. Such curing may be for a time of about thirty minutes or the like. Under such conditions, the palladium and carbon matrix may have a carbon content ranging from about thirty-six weight percent to about forty weight percent (e.g., an about thirty-seven percent carbon content) and/or may have a metal nanoparticle size primarily of about twenty nanometers to about thirty nanometers (e.g., at least one metal nanoparticle may be this size, the mean nanoparticle size may be this size, or the like).

In operation, process 600 may be utilized to form a strain sensitive sensor and/or to form a substantially strain resistant conduit, depending on processing conditions, such as temperature or time of curing, for example. This technique may be implemented to form both strain sensitive sensor and a substantially strain resistant conduit from the same or similar deposited materials, by merely varying the curing temperature applied to individual metal traces. For example, metal traces cured at one temperature may result in a palladium and carbon matrix suitable for a strain sensitive sensor, while metal traces cured at a second temperature may result in a palladium and carbon matrix suitable for a substantially strain resistant conduit. Accordingly, process 600 may operate as a direct, single step, solution-based process with good control over the electronic property of strain sensitive sensors and/or strain resistant conduits. As will be discussed in greater detail below, the gauge factor (e.g., the relative change in a component's resistance divided by the strain applied) of strain sensitive sensors and/or strain resistant conduits may be tuned by simply varying the curing temperature and/or time.

Referring to FIGS. 7-13, test results are discussed with regard to several experimental examples. In these experimental examples, metal traces (e.g., metal traces 104 discussed above with regard to FIG. 1 and/or FIG. 2) were formed under various curing conditions and subjected to various tests. In these experimental examples, metal traces 104 were fabricated by micromolding palladium alkanethiolate on polyimide substrates and subjecting it to thermolysis-type curing in air. A flexible polyimide substrate, with a thickness of about twenty micrometers was used as a substrate for molding palladium metal traces 104.

Palladium hexadecylthiolate in toluene (10 milli-Moles) served as a precursor for molding, using a polydimethylsiloxane (PDMS) stamp, which upon thermolysis at one-hundred and ninety-five degrees Celsius led to nanocrystalline palladium metal traces inside the microchannels. Polyimide can easily withstand such temperatures without losing its flexibility. Although the thermolysis of the precursor may be expected to remove the hydrocarbon by desorption, depending on the temperature, some amount of carbon may be left behind. In this sense, the palladium metal traces are nanocomposites of palladium nanoparticles in carbon matrix. The formed palladium metal traces had a width of about one micrometer spaced apart by about one-half micrometer, in conformity with the PDMS mold. A pair of gold electrodes was deposited onto the metal traces by shadow masking such that as many as seventy-five-hundred metal traces ran perpendicular to the gold electrodes. Metallic contacts were drawn from the Au pads using silver epoxy.

The nanoparticle size, the nature and content of the carbon, and the resistance of metal traces 104 were found to be dependent on the thermolysis temperature. A thermolysis temperature of one-hundred and ninety-five degrees Celsius produced stripes containing small palladium nanoparticles with a considerable proportion of carbon. The corresponding resistance may be typically in the mega-Ohm range. Additionally or alternatively, metal traces 104 formed at one-hundred and ninety-five degrees Celsius may serve as strain sensitive sensors with a gauge factor as high as three-hundred and ninety.

Figure 7:
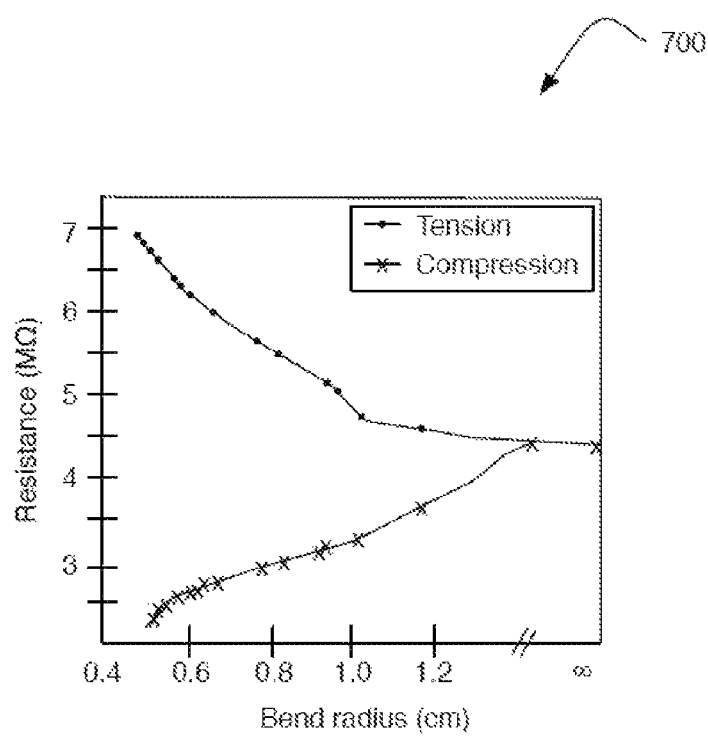
FIG. 7 is an illustration of a graph of bend radius verses resistance.

FIG. 7 is an illustration of a graph 700 of bend radius verses resistance, arranged in accordance with at least some embodiments of the present disclosure. In the illustrated example, a variation of resistance with bend radius is plotted during tension and compression. The resistance of strain sensitive sensor 502 (e.g., see FIG. 5) was measured in the ambient at room temperature for varying bent radius, under both tension and compression. This sensing action may be dependent on the curing conditions (e.g., thermolysis temperature). In the illustrated example, metal traces may be cured for a time of about thirty minutes at a temperature of about one-hundred and ninety-five degrees Celsius, for example. With strain sensitive sensor 502 held flat, the collective resistance of metal traces (e.g., metal traces 104 discussed above with regard to FIG. 1) was 4.34 mega-ohms (MΩ). When metal traces 104 were subjected to tensile strain the bending radius decreasing from ∞ (e.g., flat) to below a half a centimeter, the resistance of strain sensitive sensor 502 gradually increased to 6.82 MΩ as shown in graph 700. On the other hand, under compressive strain, the resistance of strain sensitive sensor 502 decreased gradually to 2.48 MΩ, also shown in graph 700. The release of either strain brought strain sensitive sensor 502 back to its original flat position with characteristic resistance.

Figure 8:
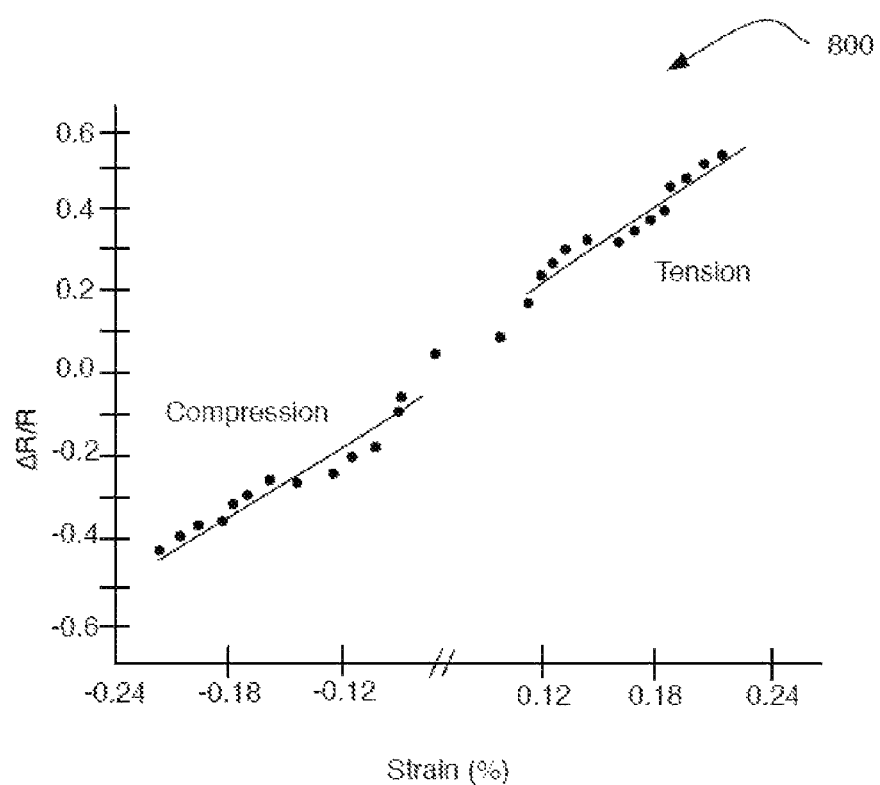
FIG. 8 is an illustration of a graph of strain percent verses change in resistance.

FIG. 8 is an illustration of a graph 800 of strain percent verses change in resistance, arranged in accordance with at least some embodiments of the present disclosure. In the illustrated example, a normalized change in resistance is plotted as a function of strain. The percentage strain (ϵ) was calculated from the equation $\epsilon=d/2r$, were d may represent the substrate thickness and r may represent the radius of curvature. The slope of graph 800 may be utilized as the gauge factor, which may define the performance of a strain sensitive sensor. In the illustrated example, metal traces may be cured for a time of about thirty minutes at a temperature of about one-hundred and ninety-five degrees Celsius, for example. For the data shown in graph 800, the gauge factor of metal traces (e.g., metal traces 104 discussed above with regard to FIG. 1) associated with a strain sensitive sensor may be estimated to be approximately three-hundred and ninety for tensile strain and approximately two-hundred and forty-nine for compressive strain.

Additionally or alternatively, under such conditions, metal traces (e.g., metal traces 104 discussed above with regard to FIG. 1) associated with a strain sensitive sensor may have a working range of strain of about 0.2 percent. For example, a strain sensitive sensor may be sensitive to strains as low as about 0.09 percent. For example, a strain sensitive sensor may be sensitive to strains with a broad range of values of about 0.09 to about 1.0 percent, a narrower range of about 0.09 to about 0.5 percent, and/or a target value of about 0.09 percent.

Additionally or alternatively, under such conditions, such a strain sensitive sensor may have a minimum excitation voltage of about 0.2 volts. For example, such a strain sensitive sensor may have a minimum excitation voltage with a broad range of values of about 0.05 to about 2.0 volts, a narrower range of about 0.1 to about 1.0 volts, and/or a target value of about 0.2 volts.

Figure 9:
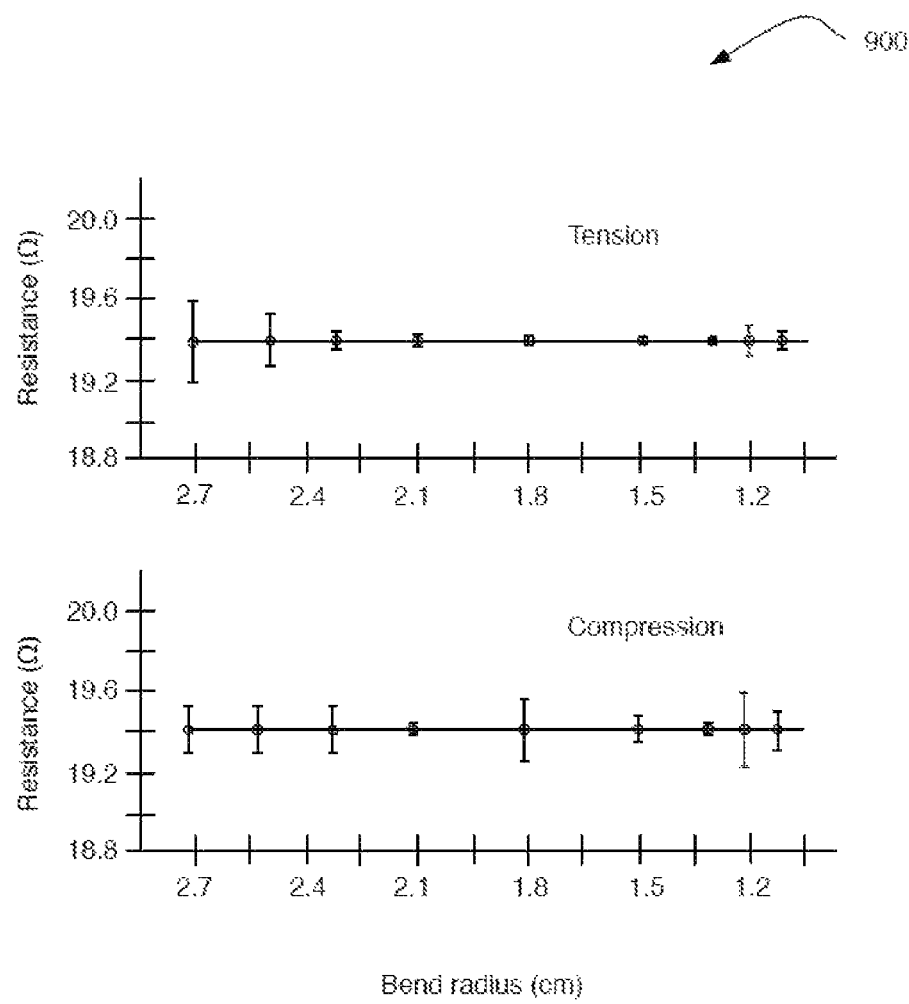
FIG. 9 is an illustration of a graph of bend radius verses resistance.

FIG. 9 is an illustration of a graph 900 of bend radius verses resistance, arranged in accordance with at least some embodiments of the present disclosure. In the illustrated example, the resistance of strain resistant conduit 504 (e.g., see FIG. 5) was measured. Curing of strain resistant conduit 504 may be conducted for a time of about thirty minutes at a temperature of about two-hundred and thirty degrees Celsius, for example. Under such conditions, strain resistant conduit 504 may have a zero-to-near-zero gauge factor in response to strain over a range of various bend radius conditions.

As illustrated in graph 900, the resistance remained nearly constant at 19.4±0.2 ohms. It may be noted that metal traces produced by curing (e.g., thermolysis) between two-hundred degrees Celsius and two-hundred and twenty-five degrees Celsius were relatively poorly conducting and also exhibited little response to strain. The metal traces produced by curing at about one-hundred and eighty degrees Celsius were not only highly insulating but also were poorly sensitive to strain.

Figure 10:
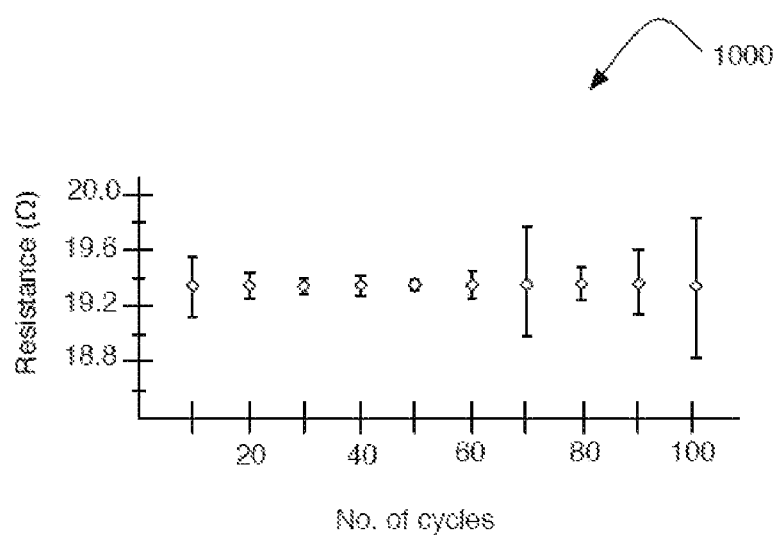
FIG. 10 is an illustration of a graph of number of cycles verses resistance.

FIG. 10 is an illustration of a graph 1000 of number of cycle verses resistance, arranged in accordance with at least some embodiments of the present disclosure. In the illustrated example, the resistance of strain resistant conduit 504 (e.g., see FIG. 5) was measured. Curing of strain resistant conduit 504 may be conducted for a time of about thirty minutes at a temperature of about two-hundred and thirty degrees Celsius, for example. Under such conditions, strain resistant conduit 504 may have a zero-to-near-zero gauge factor in response to strain over a range of number of cycles at a bend radius. In the illustrated example, a bend radius of 1.1 cm was used. As illustrated in graph 1000, strain resistant conduit 504 was stable even after one-hundred cycles of bending.

Figure 11:
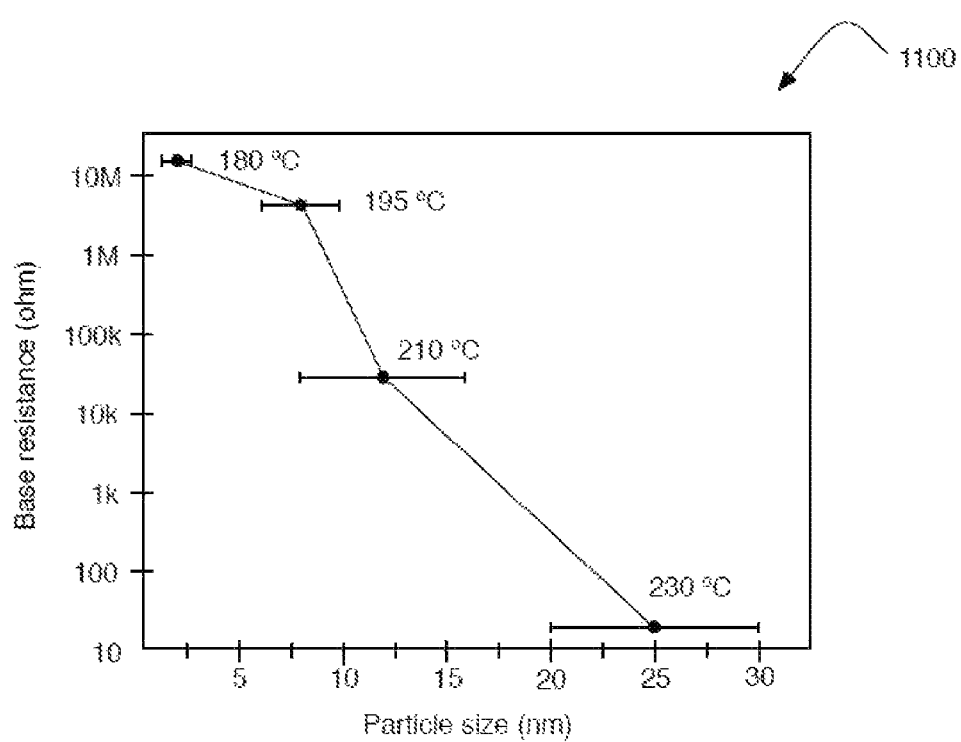
FIG. 11 is an illustration of a graph of particle size verses base resistance.

FIG. 11 is an illustration of a graph 1100 of particle size verses base resistance, arranged in accordance with at least some embodiments of the present disclosure. In the illustrated example, metal traces may be cured for a time of about thirty minutes at a temperature of about one-hundred and ninety-five degrees Celsius, for example. Under such conditions, metal traces (e.g., metal traces 104 discussed above with regard to FIG. 1) associated with a strain sensitive sensor may have a metal nanoparticle size primarily in a range of about six to ten nanometers.

Additionally, such curing may be conducted at a temperature in a range of about two-hundred and thirty degrees Celsius to about two-hundred and fifty degrees Celsius. Such curing may be for a time of about thirty minutes or the like. Under such conditions, metal traces (e.g., metal traces 104 discussed above with regard to FIG. 2) associated with a substantially strain resistant conduit may have a metal nanoparticle size primarily in a range of about twenty to thirty nanometers in the metal and carbon matrix. The resistance associated with a substantially strain resistant conduit may vary depending on the particular curing temperature utilized.

Additionally, as illustrated in Table 1 below, an energy-dispersive spectroscopy (EDS) analysis may be performed on films metal traces cured at specific temperatures. In some embodiments, such curing may be conducted for a time of about thirty minutes at a temperature of about one-hundred and ninety-five degrees Celsius, for example. Under such conditions, metal traces (e.g., metal traces 104 discussed above with regard to FIG. 1) may have a carbon content ranging from about fifty-five weight percent to about sixty weight percent (e.g., an about fifty-eight percent carbon content). In some embodiments, such curing may be conducted at a temperature of about two-hundred and thirty degrees Celsius to about two-hundred and fifty degrees Celsius. Such curing may be for a time of about thirty minutes or the like. Under such conditions, metal traces (e.g., metal traces 104 discussed above with regard to FIG. 2) may have about thirty-seven percent carbon content.

TABLE 1

Carbon content in metal traces with the corresponding thermolysis temperatures.

| Thermolysis temperature (° C.) | Carbon content from EDS (%) |
|---|---|
| 230 | 37.7 (range of about 36 to about 40) |
| 210 | 46.9 (range of about 45 to about 50) |
| 195 | 58.6 (range of about 55 to about 60) |
| 180 | 62.5 (range of about 60 to about 65) |

Figure 12:
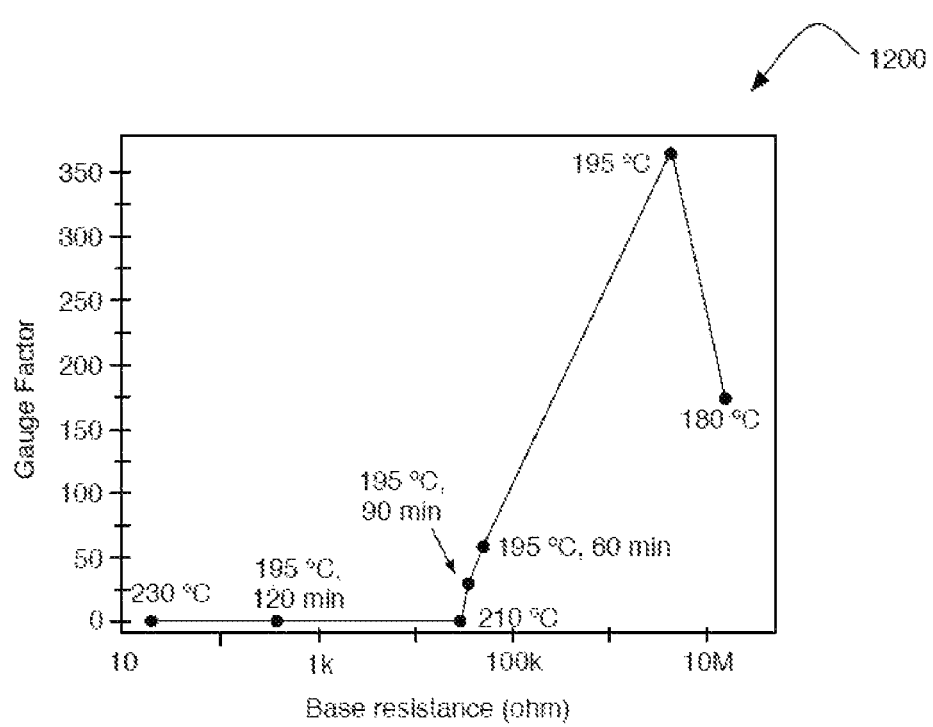
FIG. 12 is an illustration of a graph of base resistance verses gauge factor.

FIG. 12 is an illustration of a graph 1200 of base resistance verses gauge factor, arranged in accordance with at least some embodiments of the present disclosure. The gauge factor for a strain sensitive sensor may be the relative change in the sensor's resistance divided by the strain applied. In a flexible circuit, strain resistant conduits would, if at all possible, exhibit near zero gauge factor over repeated bending, unlike user interface components for which high gauge factors may be desirable. In the illustrated example, a strain sensitive sensor 502 (e.g., See FIG. 5) formed at about one-hundred and ninety-five degrees Celsius for about thirty minutes may have a gauge factor of about three-hundred and ninety, or more generally from about three-hundred to about four-hundred in response to strain.

Figure 13:
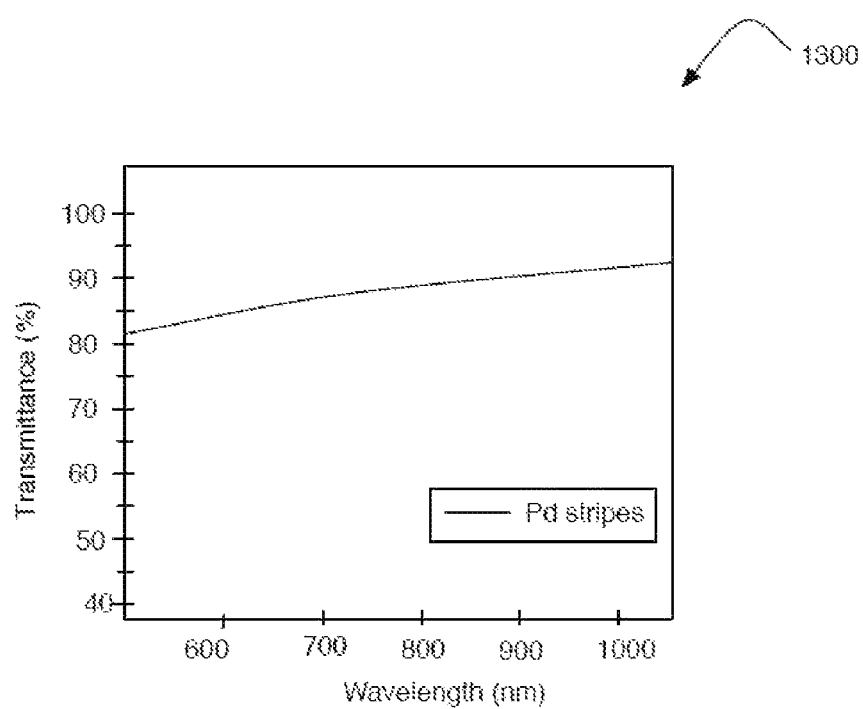
FIG. 13 is an illustration of a graph of wavelength verses transmittance with blank polyimide substrate as the reference.

FIG. 13 is an illustration of a graph 1300 of wavelength verses transmittance, arranged in accordance with at least some embodiments of the present disclosure. As illustrated, palladium metal traces (e.g., metal traces 104 discussed above with regard to FIGS. 1 and/or 2) may be tested for transmittance at various wavelengths. For example, the palladium metal traces may exhibit a transmittance of about eighty percent to electromagnetic radiation of wavelengths greater than about five-hundred and fifty nanometers. Accordingly, substantially strain resistant conduits and/or strain sensitive sensors made from metal traces (e.g., metal traces 104 discussed above with regard to FIGS. 1 and/or 2) may be substantially transparent to electromagnetic radiation of wavelengths ranging from about five-hundred and fifty nanometers to about eleven-hundred nanometers. In addition, a polyimide-type substrate may have strong absorption in a four-hundred to five-hundred nanometer range.

Additionally, strain sensitive sensor 502 (e.g., see FIG. 5) was experimentally found to be resistant to temperature variations (e.g., the temperature coefficient of resistance experimental strain sensitive sensor was around 0.00228 K$^{-1}$) in ambient air.

As metal traces 104 (e.g., See FIG. 1) may exhibit relatively good transparency in the visible range, transparent strain sensitive sensors may be realized. Similarly, as metal traces 104 (e.g., See FIG. 1) may exhibit relatively good transparency in the visible range, transparent substantially strain resistant conduits may be realized. Accordingly, substantially strain resistant conduits and/or strain sensitive sensors may be made to be substantially transparent to light in the visible spectrum.

As may be seen from FIGS. 7-10, the temperature of thermolysis may affect the electrical property of the metal traces and thus may have an effect on the sensing ability. Thermolysis may influence the constitution of the metal trace in two ways namely, the palladium nanoparticle size and the nature of the carbon matrix that is left behind after thermolysis. Thus at a temperature of one-hundred and ninety-five degrees Celsius, small nanoparticles may be produced. The hydrocarbon decomposition appears to be incomplete and as a result, the overall carbon content may remain comparable to the precursor state itself.

The particle size increased with the thermolysis temperature while the resistance of the stripes decreased. Thus, the metal traces may exhibit a wide range of resistance depending on the thermolysis temperature. The stripes resulting from the two-hundred and thirty degrees Celsius thermolysis may be essentially metallic and exhibited little-to-no change in resistance with change in bend radius, which may mean that the gauge factor could be zero in this case. The thermolysis at two-hundred and thirty degrees Celsius may yield bigger palladium nanoparticles twenty to thirty nanometers) surrounded by smaller particles (three to five nanometers) and less carbon, a fraction of it being graphitic. The thermolysis time may also have an influence of the particle size and the nature of carbon. When the time duration was increased from thirty minutes to sixty, ninety, and one-hundred and twenty minutes at one-hundred and ninety-five degrees Celsius, the base resistance decreased, with the corresponding decreasing gauge factors. Given the constitution of these metal traces, the strain may be considered to induce a change in the electronic coupling between the nanoparticles. With the metal traces obtained from the one-hundred and ninety-five degrees Celsius thermolysis, the scenario may result in a nanoparticle size as well as nature and content of carbon that, the electronic coupling becomes most sensitive to any tiny change in the nanoparticle environment. As the resistance may be dominated by the contact resistance between the nanoparticles interfaces, a strain sensitive sensor may be more sensitive to tensile strain, rather than compressive. If the base resistance becomes even higher as in the case of metal traces resulting from one-hundred and eighty degrees Celsius, the interparticle coupling may be nearly lost making the sensing action less effective.

FIG. 14 illustrates an example computer program product 1400 that may be arranged in accordance with at least some examples of the present disclosure. Computer program product 1400 may include a signal bearing medium 1402. Signal bearing medium 1402 may include one or more machine-readable instructions 1404, which, if executed by one or more processors, may operatively enable a computing device to provide the functionality described above with respect to FIG. 6. Thus, for example, one or more computing devices may undertake one or more of the actions shown in FIG. 6 in response to instructions 1404 conveyed by signal bearing medium 1402 to generate strain sensitive sensors and/or strain resistant conduits.

In some implementations, signal bearing medium 1402 may encompass a non-transitory computer-readable medium 1406, such as, but not limited to, a hard disk drive, a Compact Disc (CD), a Digital Versatile Disk (DVD), a digital tape, memory, etc. In some implementations, signal bearing medium 1402 may encompass a recordable medium 1408, such as, but not limited to, memory, read/write (R/W) CDs, R/W DVDs, etc. In some implementations, signal bearing medium 1402 may encompass communications medium 1410, such as, but not limited to, a digital and/or an analog communication medium (e.g., a fiber optic cable, a waveguide, a wired communications link, a wireless communication link, etc.).

Figure 15:
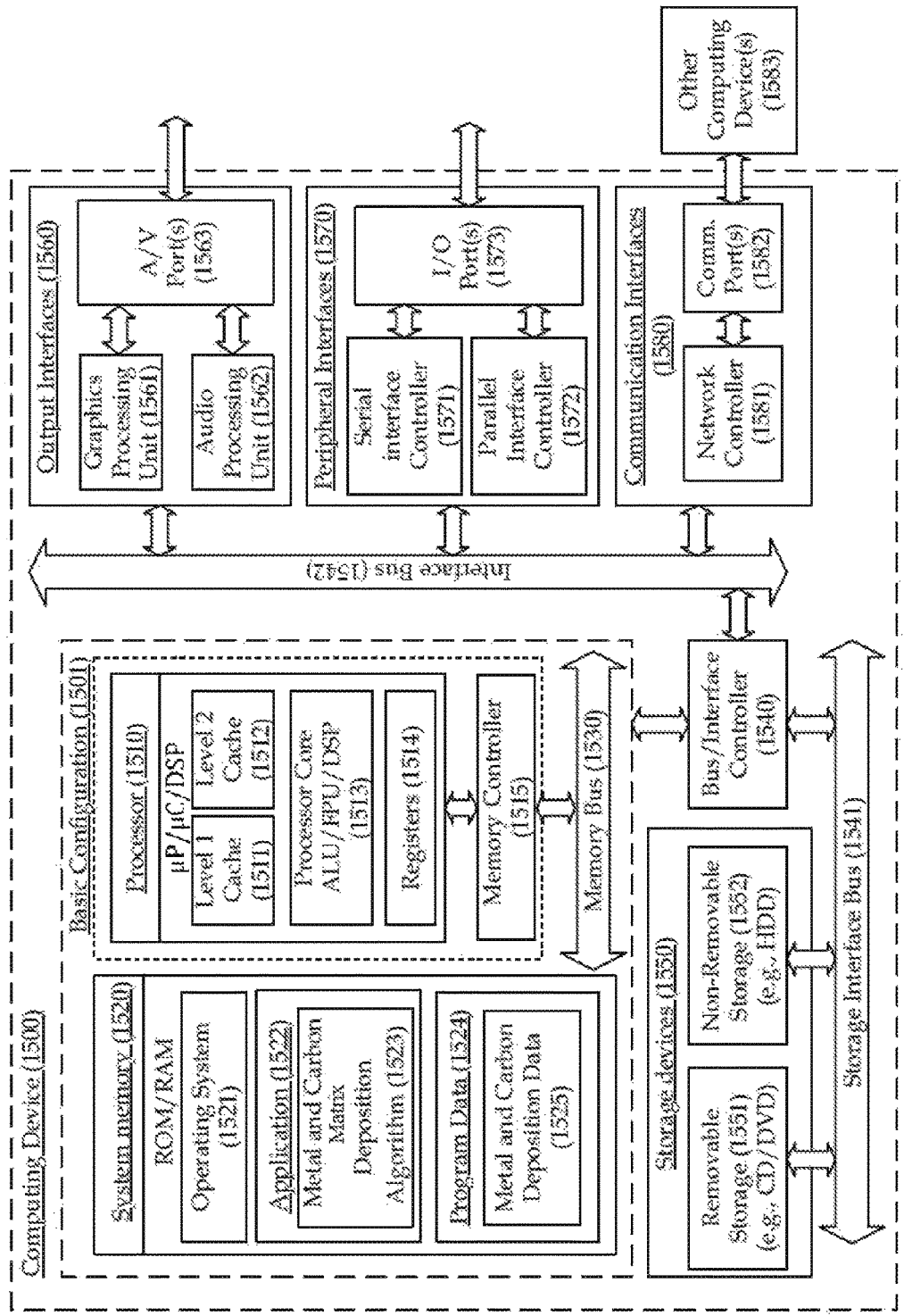
FIG. 15 is a block diagram illustrating an example computing device.

FIG. 15 is a block diagram illustrating an example computing device 1500, such as might be embodied by a person skilled in the art, which may be arranged in accordance with at least some embodiments of the present disclosure. In one example configuration 1501, computing device 1500 may include one or more processors 1510 and system memory 1520. A memory bus 1530 may be used for communicating between the processor 1510 and the system memory 1520.

Depending on the desired configuration, processor 1510 may be of any type including but not limited to a microprocessor (μP), a microcontroller (μC), a digital signal processor (DSP), or any combination thereof. Processor 1510 may include one or more levels of caching, such as a level one cache 1511 and a level two cache 1512, a processor core 1513, and registers 1514. The processor core 1513 may include an arithmetic logic unit (ALU), a floating point unit (FPU), a digital signal processing core (DSP Core), or any combination thereof. A memory controller 1515 may also be used with the processor 1510, or in some implementations the memory controller 1515 may be an internal part of the processor 1510.

Depending on the desired configuration, the system memory 1520 may be of any type including but not limited to volatile memory (such as RAM), non-volatile memory (such as ROM, flash memory, etc.) or any combination thereof. System memory 1520 may include an operating system 1521, one or more applications 1522, and program data 1524. Application 1522 may include a metal and carbon matrix deposition algorithm 1523 for manufacturing strain sensitive sensors and/or strain resistant conduits that is arranged to perform the functions as described herein including the functional blocks and/or actions described with respect to at least process 600 of FIG. 6. Program Data 1524 may include metal and carbon deposition data 1525 for use with metal and carbon matrix deposition algorithm 1523. In some example embodiments, application 1522 may be arranged to operate with program data 1524 on an operating system 1521 such that implementations of manufacturing strain sensitive sensors and/or strain resistant conduits may be provided as described herein. For example, one or more computing devices 1500 may be capable of performing all or a portion of application 1522 such that implementations of manufacturing strain sensitive sensors and/or strain resistant conduits may be provided as described herein. This described basic configuration is illustrated in FIG. 15 by those components within dashed line.

Computing device 1500 may have additional features or functionality, and additional interfaces to facilitate communications between the basic configuration 1501 and any required devices and interfaces. For example, a bus/interface controller 1540 may be used to facilitate communications between the basic configuration 1501 and one or more data storage devices 1550 via a storage interface bus 1541. The data storage devices 1550 may be removable storage devices 1551, non-removable storage devices 1552, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 1520, removable storage 1551 and non-removable storage 1552 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 1500. Any such computer storage media may be part of computing device 1500.

Computing device 1500 may also include an interface bus 1542 for facilitating communication from various interface devices (e.g., output interfaces, peripheral interfaces, and communication interfaces) to the basic configuration 1501 via the bus/interface controller 1540. Example output interfaces 1560 may include a graphics processing unit 1561 and an audio processing unit 1562, which may be configured to communicate to various external devices such as a display or speakers via one or more A/V ports 1563. Example peripheral interfaces 1570 may include a serial interface controller 1571 or a parallel interface controller 1572, which may be configured to communicate with external devices such as input devices (e.g., keyboard, mouse, pen, voice input device, touch input device, etc.) or other peripheral devices (e.g., printer, scanner, etc.) via one or more I/O ports 1573. An example communication interface 1580 includes a network controller 1581, which may be arranged to facilitate communications with one or more other computing devices 1583 over a network communication via one or more communication ports 1582. A communication connection is one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR) and other wireless media. The term computer readable media as used herein may include both storage media and communication media.

Computing device 1500 may be implemented as a portion of a small-form factor portable (or mobile) electronic device such as a cell phone, a personal data assistant (PDA), a personal media player device, a wireless web-watch device, a personal headset device, an application specific device, or a hybrid device that includes any of the above functions. Computing device 1500 may also be implemented as a personal computer including both laptop computer and non-laptop computer configurations. In addition, computing device 1500 may be implemented as part of a wireless base station or other wireless system or device.

Some portions of the foregoing detailed description are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing device, that manipulates or transforms data represented as physical electronic or magnetic quantities within memories, registers, or other information storage devices, transmission devices, or display devices of the computing device.

Claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a signal bearing medium, a storage medium and/or storage media. This storage media, such as CD-ROMs, computer disks, flash memory, or the like, for example, may have instructions stored thereon, that, when executed by a computing device, such as a computing system, computing platform, or other system, for example, may result in execution of a processor in accordance with claimed subject matter, such as one of the implementations previously described, for example. As one possibility, a computing device may include one or more processing units or processors, one or more input/output devices, such as a display, a keyboard and/or a mouse, and one or more memories, such as static random access memory, dynamic random access memory, flash memory, and/or a hard drive.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a flexible disk, a hard disk drive (HDD), a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed:

1. An apparatus, comprising:
   a substrate;
   a first flexible electronic part located on the substrate, wherein the first flexible electronic part comprises a substantially strain resistant conduit having a first carbon content; and
   a second flexible electronic part located on the substrate, wherein the second flexible electronic part comprises a strain sensitive sensor having a second carbon content greater than the first carbon content, wherein the substantially strain resistant conduit and the strain sensitive sensor both comprise a metal and carbon matrix.

2. The apparatus of claim 1, wherein the metal comprises palladium.

3. The apparatus of claim 1, wherein the substantially strain resistant conduit and/or the strain sensitive sensor have a size of about one hundred nanometers to about ten microns.

4. The apparatus of claim 1, wherein the substantially strain resistant conduit comprises one or more of an interconnect, an electrode, a connector, a wire, and a conductive trace.

5. The apparatus of claim 1, wherein the substrate is of a size ranging from about one inch to about thirty inches.

6. The apparatus of claim 1, wherein the substantially strain resistant conduit has a zero-to-near-zero gauge factor in response to strain.

7. The apparatus of claim 1, wherein the substantially strain resistant conduit comprises at least one metal nanoparticle of about twenty to thirty nanometers in size in the metal and carbon matrix.

8. The apparatus of claim 1, wherein the substantially strain resistant conduit comprises a mean nanoparticle size of about twenty to thirty nanometers in the metal and carbon matrix.

9. The apparatus of claim 1, wherein the substantially strain resistant conduit has the first carbon content ranging from about thirty-six weight percent to about forty weight percent in the metal and carbon matrix.

10. The apparatus of claim 1, wherein the strain sensitive sensor has a gauge factor from about three-hundred to about four-hundred in response to strain.

11. The apparatus of claim 1, wherein the strain sensitive sensor has a minimum excitation voltage of about 0.2 volts.

12. The apparatus of claim 1, wherein the strain sensitive sensor is sensitive to strains as low as about 0.09 percent.

13. The apparatus of claim 1, wherein the strain sensitive sensor comprises at least one metal nanoparticle of about six to ten nanometers in size in the metal and carbon matrix.

14. The apparatus of claim 1, wherein the strain sensitive sensor comprises a mean nanoparticle size of about six to ten nanometers in the metal and carbon matrix.

15. The apparatus of claim 1, wherein the strain sensitive sensor has a carbon content ranging from about fifty-five weight percent to about sixty weight percent in the metal and carbon matrix.

16. The apparatus of claim 1, wherein the substantially strain resistant conduit and the strain sensitive sensor are both substantially transparent to electromagnetic radiation of wavelengths ranging from about five-hundred and fifty nanometers to about eleven-hundred nanometers.

17. The apparatus of claim 1, wherein the substantially strain resistant conduit and the strain sensitive sensor both exhibit a transmittance of about eighty percent to electromagnetic radiation of wavelengths greater than about five-hundred and fifty nanometers.

18. The apparatus of claim 1, wherein the apparatus comprises one or more of a touch sensitive display, a flexible solar cell, a flexible display, a stretchable display, a rollable display, and combinations thereof.

19. A method to form a strain sensitive sensor, the method comprising:
    depositing a plurality of metal traces substantially parallel to one another on a substrate, wherein the traces include palladium;
    curing the plurality of metal traces for a specified time and temperature to form a palladium and carbon matrix, wherein the cured metal traces have a gauge factor from about three-hundred to about four-hundred in response to strain; and
    depositing a first electrode in contact with one end of the plurality of metal traces and a second electrode in contact with an opposite end of the plurality of metal traces.

20. The method of claim 19, wherein depositing the plurality of metal traces on the substrate includes depositing the plurality of metal traces on a substrate that comprises one or more of: flexible polyimide, polyester, polyethylene naphthalate, aramid, poly(dimethylsiloxane), epoxy, or liquid crystal polymer.

21. The method of claim 19, wherein depositing the plurality of metal traces substantially parallel to one another includes depositing individual metal traces that are spaced apart by a width of about one-half micrometer.

22. The method of claim 19, wherein curing the plurality of metal traces for the specified time and temperature comprise curing the plurality of metal traces for a time of about thirty minutes at a temperature of about one-hundred and ninety-five degrees Celsius.

23. A method to form a strain resistant conduit, the method comprising:
    depositing a metal trace on a substrate, wherein the metal trace includes palladium; and
    curing the metal trace for a specified time and temperature to form a palladium and carbon matrix, wherein the specified time and temperature comprise a time of about thirty minutes at a temperature of about two hundred thirty degrees Celsius and are effective to cause the cured metal trace to exhibit a zero-to-near-zero gauge factor in response to strain over a radius.

* * * * *